United States Patent [19]

Scheuneman

[11] 4,357,686

[45] Nov. 2, 1982

[54] HIDDEN MEMORY REFRESH

[75] Inventor: James H. Scheuneman, St. Paul, Minn.

[73] Assignee: Sperry Corporation, New York, N.Y.

[21] Appl. No.: 190,156

[22] Filed: Sep. 24, 1980

[51] Int. Cl.³ .............................................. G11C 13/00
[52] U.S. Cl. ..................................... 365/222; 365/230
[58] Field of Search ............................... 365/222, 230

[56] References Cited

U.S. PATENT DOCUMENTS

| | | | |
|---|---|---|---|
| 3,719,932 | 3/1973 | Cappon | 365/222 |
| 3,760,379 | 9/1973 | Nibby et al. | 365/222 |
| 3,810,129 | 5/1974 | Behman et al. | 365/222 |
| 3,811,117 | 5/1974 | Anderson et al. | 365/222 |

*Primary Examiner*—Terrell W. Fears
*Attorney, Agent, or Firm*—Douglas L. Tschida; Kenneth T. Grace; Marshall M. Truex

[57] ABSTRACT

A memory array having a dedicated refresh flag memory (RFM) for maintaining a record of the array's addresses that are accessed during a refresh requirement interval (RRI) and means for reading the RFM during the RRI and refreshing those array addresses which weren't accessed during the operating interval of the RRI. The refresh operation being performed in a "burst" mode or in an "interleaved" mode during the RRI.

2 Claims, 10 Drawing Figures

HIDDEN MEMORY REFRESH

BACKGROUND OF THE INVENTION

The invention relates to charge storage memory systems of the type requiring periodic refreshing of the main memory array to restore the contents thereof. The memory array typically is comprised of a plurality of individual cells, arranged in rows and columns, and whose binary contents are dependent on the capacitive charge that is stored therein. The charge being stored between the substrate and gate of a field effect transistor, on a capacitor having one or more associated transistors or in some other charge storage structure. Such a memory is described in White, Jr. et al., U.S. Pat. No. 4,207,618 and in Dennard, U.S. Pat. No. 3,387,286. Dennard disclosing a metal oxide semiconductor random access memory (MOSRAM) and its operation, as well as the need for periodically refreshing the charge stored in the cells; and White disclosing a 65K MOSRAM having on-chip provisions for an address counter and multiplexing circuitry to select from normal and refresh accesses. The refresh time for such memories, however, typically occupies 10% to 20% of the usable time of the memory with a complete refresh operation being performed at least once during the device's refresh requirement interval (RRI).

The necessity to accommodate the RRI, however, presents a number of problems to a memory system designer when he is attempting to maximize a system's operating time. It is therefore desirable to minimize the necessity of the refresh operation by relegating it to non-active memory time and by taking advantage of the fact that as each row is normally accessed, it is refreshed. Previous solutions to the problem have been achieved by a variety of techniques; such as refreshing the entire memory array at one time in a "burst" mode (e.g. Dennard), interleaving the refresh and normal access operations (e.g. Anderson, Jr. et al., U.S. Pat. No. 3,811,117) and refreshing in parallel with normal access operations (e.g. U.S. Pat. No. 3,859,640).

The general interleaving technique taught by Anderson presents a desired solution, but it suffers in that excessive circuitry is required to accommodate the "least recently used" criteria. Anderson teaches the use of an address age memory and a comparator, but because of the added cost in associated circuitry (i.e. a counter and detector for each row of cells of the array), such a technique becomes cost prohibitive as the size of the memory array expands from the described 1K array to a 16K, 64K or 256K array, as evidenced by White. And even if the array were fabricated as an integrated circuit, such a technique would require a great deal of space on the surface of the die," which space is not accommodated in commercially available devices.

It is therefore an object of the present invention to minimize the impact of the refresh degradation of a main memory system's through-put in a cost efficient manner, using readily available devices.

It is an additional object to refresh the system's main memory array on an "if required" basis. Which objective is achieved with the aid of a refresh flag memory (RFM) that monitors each of the memory array's normal access operations during the RRI and flags the address in the RFM that corresponds to the accessed address. Thus a record is maintained of all accessed addresses during the operating period so that the system need only refresh those addresses which were not previously accessed. The total refresh time for any RRI can therefore be maintained at a minimum, especially in active systems having a majority of the addresses accessed during the RRI.

SUMMARY OF THE INVENTION

Apparatus and a method for maintaining a record of the row addresses of a memory array of "M" rows × "N" columns that are accessed during the operating period of said array's refresh requirement interval (RRI) and means for reading said record during a refresh interval of said RRI and refreshing in a "burst" mode only those addresses that were not previously accessed during the operating period.

The apparatus comprises a dedicated refresh flag memory (RFM) having a flag bit associated with each row of the system's memory array and means for writing into said RFM during said operating interval, means for accessing each row of the memory array, means for reading said RFM and refreshing only those rows of the memory array that were not accessed during the operating period and control means for effectuating the timing and control of said apparatus during said RRI.

An alternative embodiment of the invention is also described in which the refresh operation is performed in an "interleaved" mode (i.e., each address having an allotted interval within the RRI). In addition, a priority technique is described which establishes "high" and "low" priority periods, during each interleaved period and during which the refresh operation is either mandatory or optional, depending on whether or not the memory is active.

BRIEF DESCRIPTION OF THE DRAWINGS

The A portion is a timing diagram for the interleaved RFM set condition.

The B portion is a timing diagram for the interleaved RFM clear-early refresh condition.

The C portion is a timing diagram for the interleaved RFM clear-mandatory refresh condition.

DESCRIPTION OF THE PREFERRED EMBODIMENT

Figure 1:
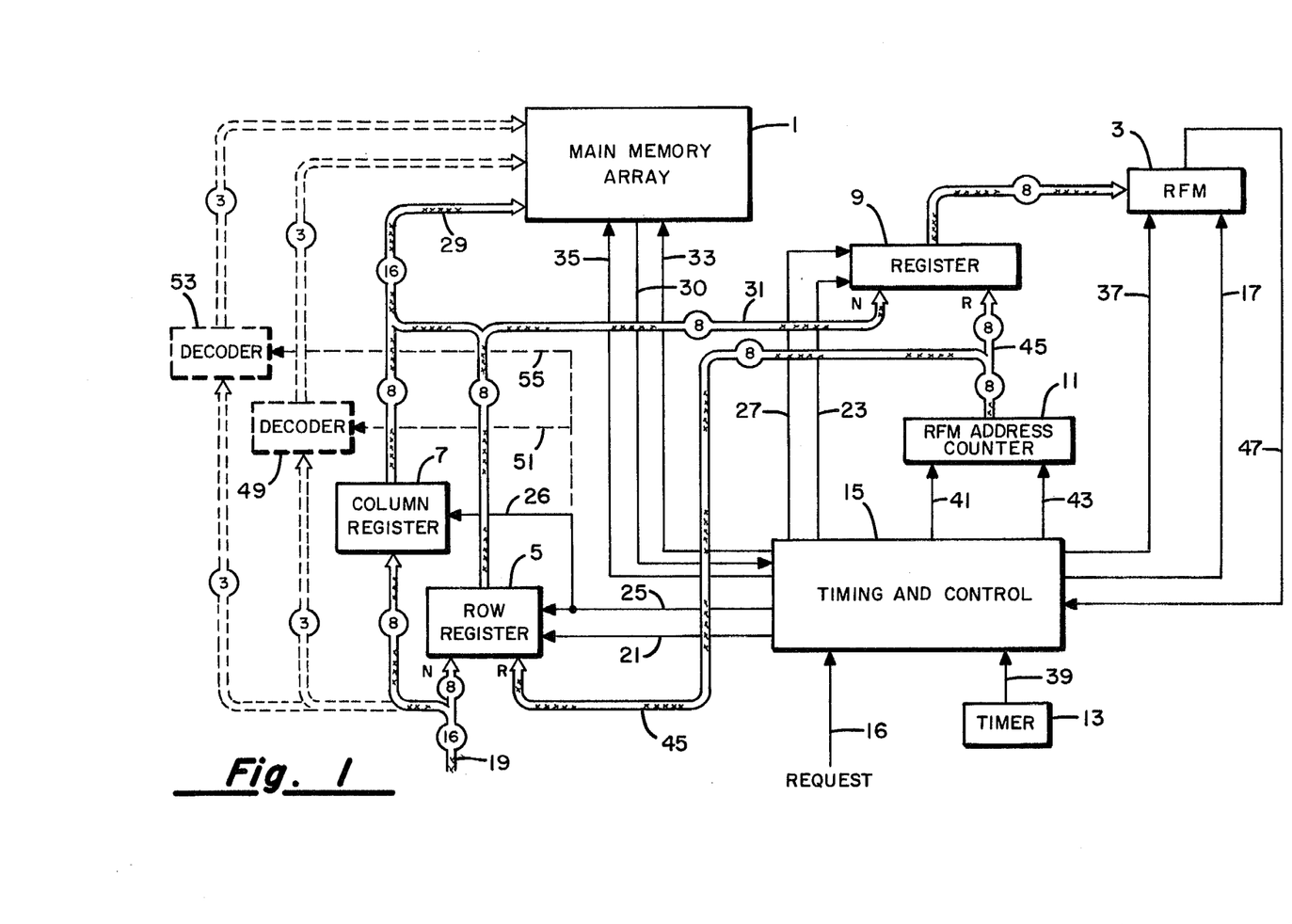
FIG. 1 is a block diagram of an expandable memory array and its associated "burst" mode hidden memory refresh circuitry.

Referring to FIG. 1, a block diagram is shown of the improved hidden memory refresh circuitry that is used to perform an improved burst mode refresh operation and which operation will be described more fully hereinafter with respect to the flow chart of FIG. 3 and the timing diagrams of FIGS. 4 and 5. The refresh circuitry essentially comprises a main memory array 1, a refresh flag memory (RFM) 3, a main memory array row address selector/register 5, a main memory array column address register 7, a RFM row address selector/register 9, a refresh address counter 11, a refresh timer 13 and the associated timing and control circuitry 15. The invention, however, will first be described with reference to a system having a monolithic, memory array 1, such as a 65K MOSRAM; then with reference to the expanded embodiments wherein the system's memory array 1 is partitioned across several monolithic devices and several printed circuit (pc) assemblies; and finally with reference to an alternative embodiment having "interleaved" refreshing and a high and low priority associated with each refresh operation.

Figure 2A:
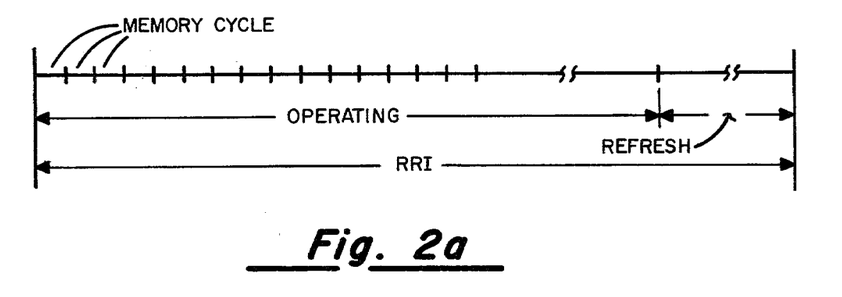
FIG. 2a is a timing diagram of the refresh requirement interval for a device such as taught by Dennard.

Referring first to FIG. 2a, a general refresh timing diagram is shown for a memory array of the type described in Dennard, U.S. Pat. No. 3,387,286. The refresh operation for such an array is performed in a single interval in a "burst" mode (i.e. one row at a time, until all of the array's rows have been refreshed, regardless of the array's prior accesses). Each RRI is thus basically divided into an operating interval and a refresh interval with each interval comprised of a plurality of memory cycles and during which cycles the array is accessed and the read/write operations are performed.

The duration of the system RRI and the various intervals will be dependent upon the size and physical characteristics of the memory array, but for a 65K MOSRAM the RRI would be approximately 6 milliseconds and the memory cycles would each be approximately 500 nanoseconds. Thus for 65K MOSRAM of M=256 rows by N=8 columns of memory cells, it would take approximately 128 microseconds or 2.1 percent of the RRI to refresh all 256 rows of the array. This however disregards the fact that as each row is accessed during the operating interval, it is refreshed. Consequently for a system in which most of the array's addresses are accessed, the actual number of rows requiring refreshing may be relatively small.

While the "least recently used" algorithm and circuitry of Anderson presents another solution (i.e. interleaving the refresh operations on a "least recently used" basis during inactive periods between active memory cycles), the approach of the present invention is to relegate the refresh operation to a number of refresh intervals, of varying duration, within the RRI and then refreshing in a "burst" mode only those addresses flagged in the RFM which were not previously accessed (i.e. on an "if required basis"). The approach is thus a hybrid of the techniques previously employed.

The approach of the present invention therefore is to monitor the system's memory array 1 during each RRI by flagging a corresponding address in the RFM 3 as each address of the array 1 is accessed so that at any point during the RRI, the RFM 3 will contain a complete history of all the array's addresses that were accessed. It is then necessary for the system only to refresh those addresses which were not previously accessed, thus shrinking the absolute time required to perform the refresh operation and minimizing the number of system interrupts, especially for an active system.

Figure 2B:
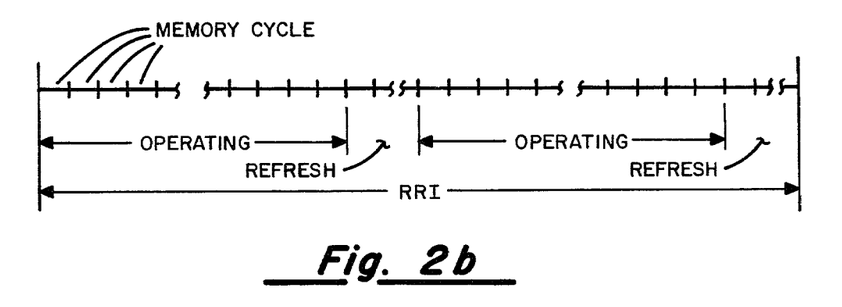
FIG. 2b is a timing diagram of a refresh requirement interval for the circuitry of FIG. 6, wherein the refreshes are interleaved over the RRI.

It is to be recognized though that if refreshing on an "if required" basis is to be effective, it is necessary to perform the refresh operation at least twice during any individual RRI. For the previously mentioned 65K MOSRAM this translates to performing a refresh operation before the midpoint and end of the RRI. The first interrogation of the RFM 3 occurring approximately 128 microseconds before the 3 millisecond midpoint of the RRI and the second refresh operation occurring 128 microseconds before the end of the RRI. Depending on the usage of the system's memory array 1, the total number of refreshes within either of the refresh intervals would typically be relatively small and the total refresh time amounting to less than 128 microseconds. Which refresh time requirement is less than that which might otherwise be required by waiting until the end of each RRI and refreshing all the rows of the array in a "burst" mode at that time. Thus it is to be further recognized that while the refresh intervals are shown in FIG. 2b to be approximately equal, their individual absolute times will vary, depending on the number of array addresses that were accessed during the preceding operating interval. If less than the total allotted refresh time is used, the system then makes use of the savings by performing additional normal accesses.

The operation of the present invention will now be described in detail with reference to FIGS. 1, 3, 4 and 5 during the respective operating and refresh intervals of a typical RRI. Upon initiating a system containing the present hidden memory refresh circuitry the control circuitry 15 applies a logic low to the read/write control line 37 which establishes the RFM 3 in a write mode. A clear signal is next applied by the control circuitry 15 to write line 17 which causes the RFM 3 to clear and set all of its memory cells to a "0" state. It is to be recognized that the RFM for the present embodiment is a 256×1 bit MOSRAM. In general though, the size is not important as it is necessary only that the RFM 3 have at least an equal number of locations as the memory array 1. It is to be further recognized that while the RFM 3 is being described with reference to a random access memory (RAM), a content addressable memory (CAM) could also be used. A CAM would provide additional time saving advantages which advantages will generally be described more fully hereinafter, but would require additional cost.

Upon clearing the RFM 3, the computing system in which the array is located and which is not shown is free to access the array 1 by applying the 16 bit requestor address signals via bus 19 to the array row address selector/register 5 and the column address register 7. It should be noted though that the bus 19 is split with the 8 bits of the requestor address corresponding to the array's column address being hardwired to register 7 and the 8 bits associated with the array's row address being hardwired to the selector/register 5.

Assuming that the array 1 is to be first operated in its normal operating mode, the system's priority control section, to be described in greater detail hereinafter, applies a logic high pulse via request line 16 to the control circuitry 15. The control circuitry 15 then applies a logic high on the selector line 21 which causes the array row address selector/register 5 to select the normal mode. At the same time the control circuitry 15 applies a similar logic high control signal on selector line 23 to the RFM row address register 9, which signal establishes register 9 in the same mode.

While the normal operating mode is being selected, in response to the requestor signals, the control circuitry 15 also applies a logic low to the row and column load lines 25 and 26 which cause the array row and column registers 5 and 7 to load the requestor address information. Immediately after the loading of the array selector/register 5, the control circuitry 15 applies a logic low pulse to the selector/register 9 load line 27 and to the array initiate line 33, the latter low causing the memory array 1, via bus 29, to access the selected requestor address. Then depending on whether a read or a write operation is to be performed, and which operation is determined by the signal on the array's read/write control line 35, the array 1 will read or write data from or into the memory array 1. At the same time as the array 1 is being accessed, the low on load line 27 causes the requestor row address to be loaded into the RFM selector/register 9 via the 8 bit bus 31. It is to be recognized however that irrespective of whether an array read or write operation is performed, the mere initiation and accessing of the array 1 causes the corresponding 8 bit row of memory cells in the array 1 to be refreshed.

After the initiation of the array 1, the control circuitry 15 applies a logic low via the RFM read/write control line 37 to the RFM 3 and at the same time a logic high via the write data line 17, which signals cause the RFM 3 to write a "1" into itself at the address corresponding to the accessed row address of the array 1. In a similar manner for each and every memory cycle during the operating interval in which requestor signals are received, the array 1 will be accessed and the RFM will write a "1" into itself at each and every address corresponding to the accessed row address of the array 1. It is to be recognized, though, that while an address may be accessed more than once within an operating interval, it is only significant for the present purposes that it was accessed at all, since the accessed rows will not have to be refreshed during the refresh interval.

Recalling that it is necessary to perform the refresh for the present system twice during each RRI, the system will proceed in a normal fashion for approximately 2,872 microseconds and then the system will interrupt itself so that the contents of the RFM can be interrogated and those addresses of the array 1 which were not previously accessed can be refreshed. Because each memory cycle is approximately 500 nanoseconds, the system is thus able to perform approximately 5,754 memory cycles before the necessity to review the RFM 3. It is to be recognized however that depending on the requestor activity of the system the memory may not be active during all of the memory cycles. It is assumed though that the system will in fact be substantially active and that the majority of the array's addresses will be accessed during the operating time so that the RFM will substantially contain all 1's. Thus the effectiveness of the present scheme depends on the activity of the array 1 and the number of different requests that are made by the system during the operating interval.

While the memory cycles occur the timer 13 keeps track of the expired time of the RRI. Timer 13 is not shown in detail but typically it is comprised of a counter which counts at the system's 500 nanosecond clock rate. Upon reaching the preset count associated with the expiration of the operating interval, the timer 13 produces an appropriate control signal which is impressed via line 39 on the control circuitry 15 and which causes the system to interrupt itself and initiate a refresh interval. Upon completion of the refresh interval the control circuitry 15 will reinitiate timer 13 and the system will continue with its interrupted operation until approximately 128 microseconds before the end of the RRI, when the timer 13 will again interrupt the system's requestor activity and initiate the second refresh interval. Again depending on the system activity and the number of different addresses accessed during the operating interval, the total refresh time within each of the two refresh periods will vary, but the total refresh time for the RRI will be less than that required by Dennard and should occur without as many interrupts as Anderson. It is to be noted though that while the timer 13 is preset for 128 microseconds, if the refresh interval is less, requests will again be taken by the priority control section before the end of the refresh interval.

Figure 3:
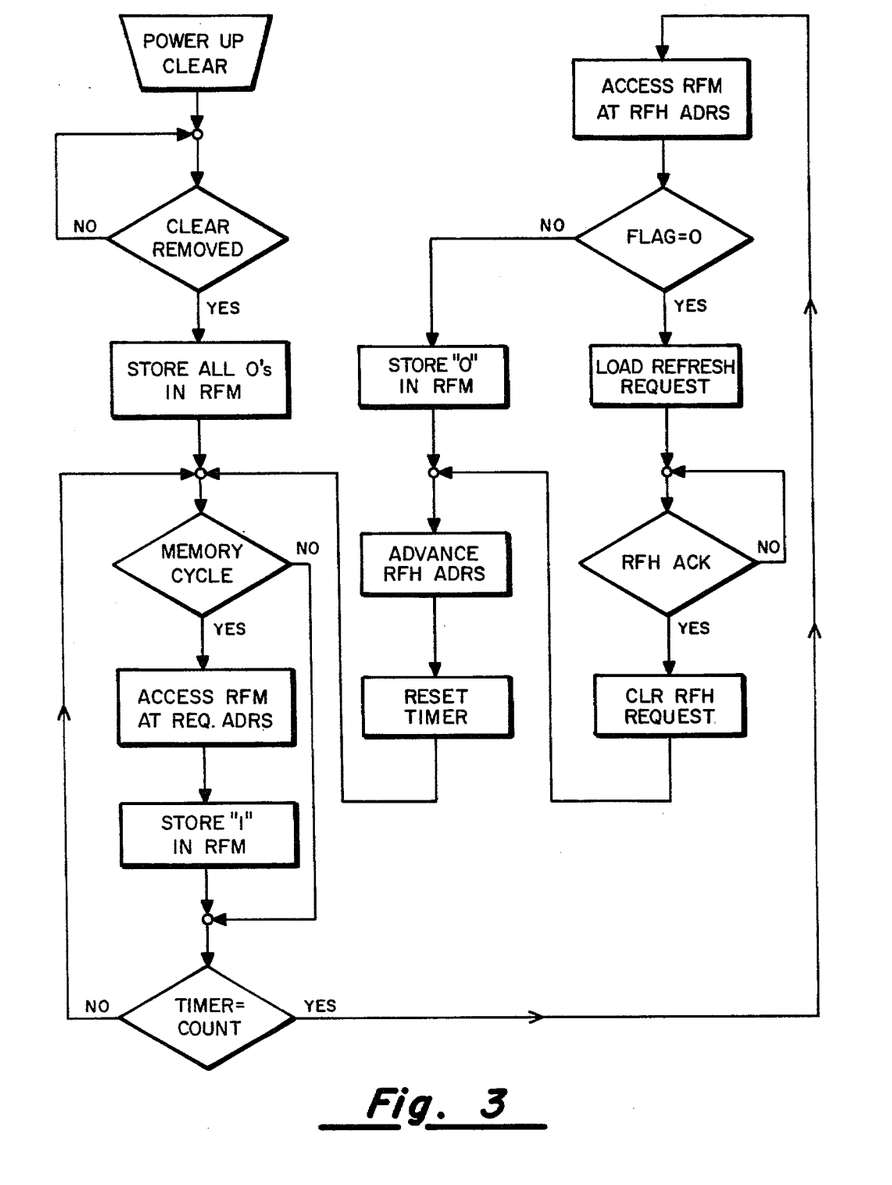
FIG. 3 is a flow chart of the sequence of events that occur during typical memory cycles or refresh operations of the system's memory array.
Figure 4:
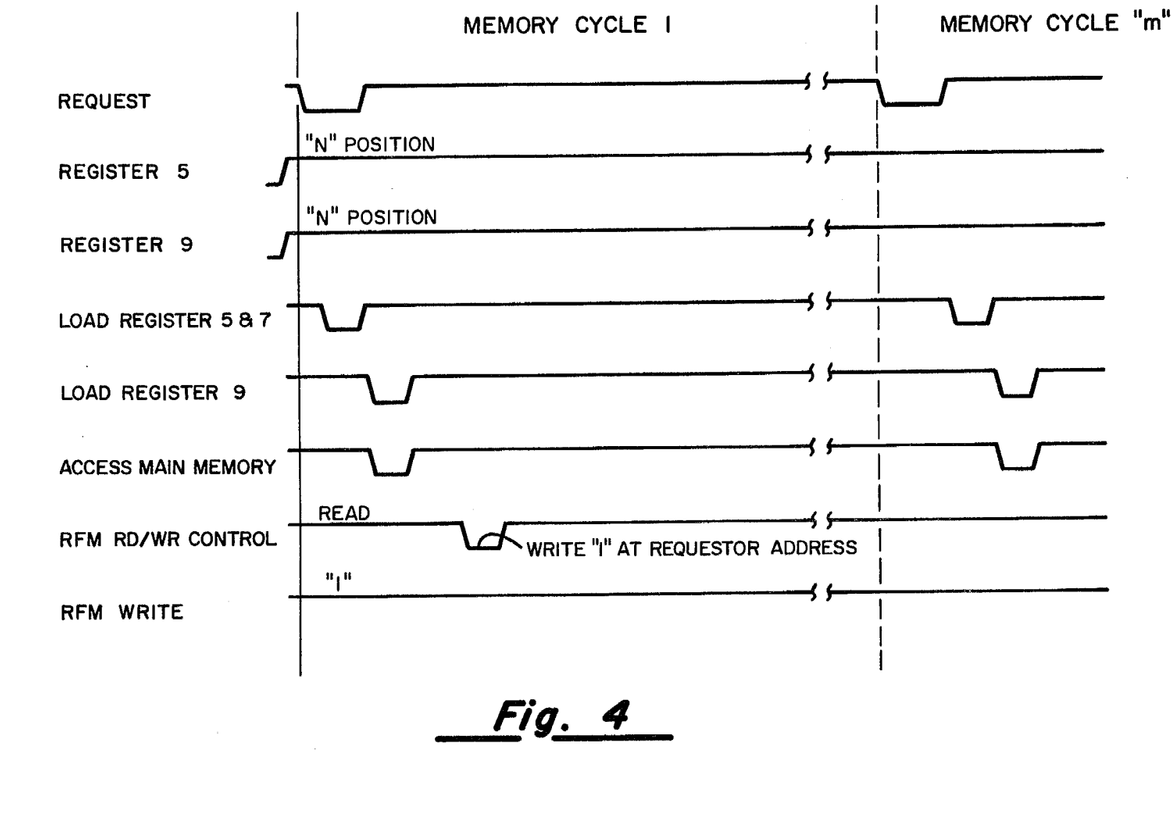
FIG. 4 is a timing diagram of the events that occur during a typical memory cycle.
Figure 5:
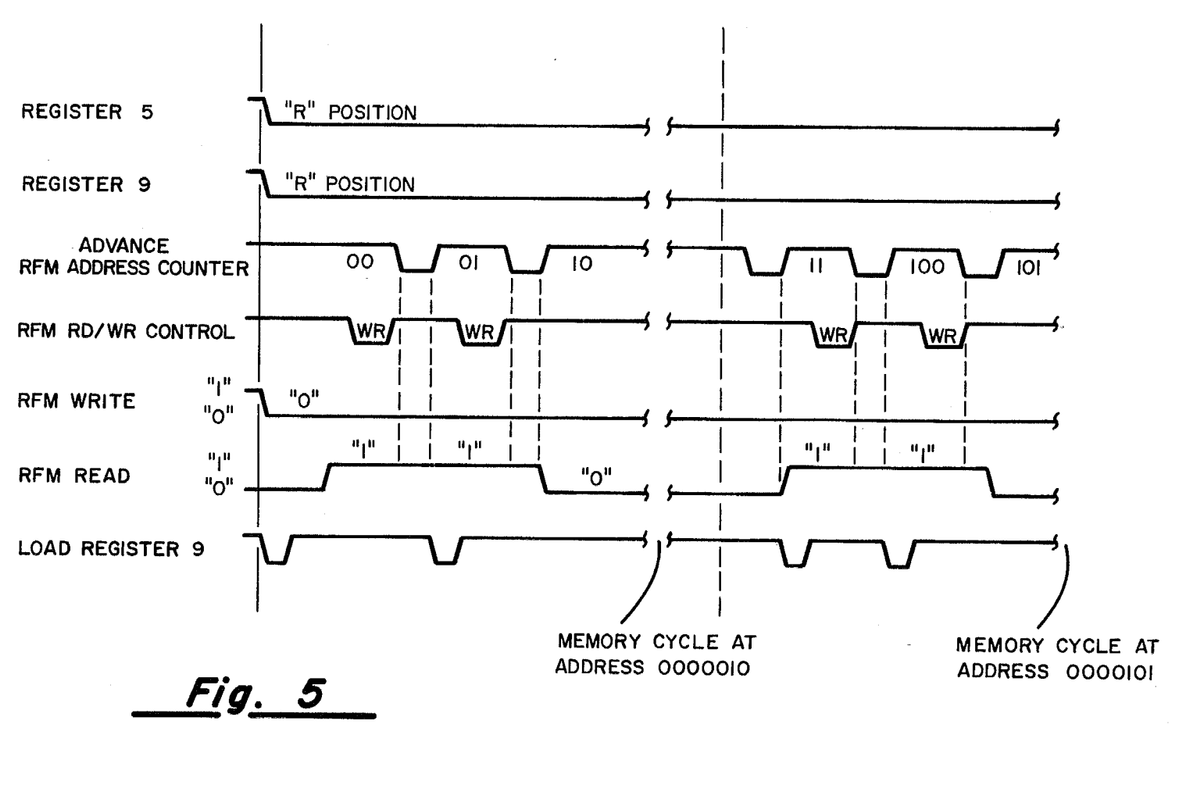
FIG. 5 is a timing diagram of the events that occur during a typical refresh operation.

Referring now to FIGS. 1, 3 and 5 the hidden memory refresh circuit's operation will be described during a typical refresh interval. As mentioned, if the count in the refresh timer 13 equals the preset count, the system is interrupted by the control circuitry 15 which produces a logic low on the selector control lines 21 and 23, and which signals switch the array and RFM row registers 5 and 9 to their refresh mode of operation, thus preventing any new requestor activity on bus 19 from affecting the array 1. At the same time, the control circuitry 15 also applies a logic high, clear signal on line 41 to the RFM address counter 11 and a logic low to the RFM write data line 17. The logic high clears the RFM address counter 11, prior to interrogating each of the RFM's addresses, which addresses will be generated by the address counter 11 at the clock frequency which is applied to the counter 11 via line 43 during the refresh interval. The logic low on the write data line 17 in turn is used to restore each of the RFM's flag bits to a binary "0" condition as the RFM's addresses are interrogated so that the RFM 3 will be cleared prior to initiation of the next operating interval.

As the counter advances via the application of the logic low pulses from the control circuitry 15 on line 43, the count is applied via the 8 bit bus 45 to the refresh ports (R) of the respective array and RFM selector/registers 5 and 9. Register 9 is then loaded and unloaded via the logic low pulses which are applied to the load line 27 after each advancement of the counter 11. The control circuitry 15 then applies a read/write control pulse train to the RFM via the read/write control line 37, which signal when high causes the RFM to read the contents of the RFM at that address and when low causes the RFM to initiate a refresh request, until all the addresses of the RFM are eventually interrogated. From FIGS. 3 and 5 it can be seen that as the counter 11 is sequentially advanced, it interrogates each address of the RFM. As the logic high read control signal is applied, if the RFM contains a logic "1" no action is taken, except to write a "0" into the RFM at that address. If the RFM contains a logic "0" (e.g. at address 00000010) the logic "0" on the RFM read data line 47 causes the control circuitry 15 to initiate a refresh, memory cycle, such as previously described. Thus the row address in counter 11 will be read in the memory array 1 and which access will cause the refreshing of that row.

During the refresh, memory cycle, the "0" condition detailed in the RFM 3 causes the control circuitry 15 to produce a logic low load signal on load line 25 which in turn causes the array selector/register 5 to load the current count of address counter 11. Control circuitry 15 then produces a logic low pulse which initiates the memory array 1, as before and causes the accessing and reading of the memory array's address that corresponds to the RFM's address that contains the "0." A refresh acknowledge (i.e. dur to the reading of array 1) is also produced and is transmitted via line 30 to the control circuitry 15. A logic low is then produced on load line 25 which acts to clear the array selector/register 5 of the refresh request so that the system can return to its sequential interrogation of the RFM and the RFM address counter 11 can advance to the next address. Upon the advancing of counter 11, the counter in timer 13 also advances and the system after the refresh access again interrogates itself to see if the next cycle is a memory cycle or a refresh cycle. Thus each address of the RFM 3 will be interrogated and only those addresses of array 1 not previously accessed during the operating interval will be refreshed.

It should be noted that the typical time necessary to access the RFM 3 and interrogate each of its associated addresses is approximately 20 nanoseconds as opposed to a 500 nanosecond memory cycle. Therefore assuming that all the addresses of the RFM contains a logic "1," the minimum refresh interval will require only approximately 5.1 microseconds or a total RRI refresh time of 10.2 microseconds. This represents a savings of approximately 108 microseconds. Thus the interrogation of the smaller, faster RFM can save approximately 216 memory cycles over the technique taught by Dennard, and facilitate design and cost parameters over the technique taught by Anderson while producing comparable time savings. It should be noted however that actual time savings comparisons have not been performed and that they could not be realized if the typical system requestor activity wasn't such as to access the majority of the array addresses during the operating interval.

Attention is also called to the row select decoder 49 that is shown in FIG. 1. The row select feature, while not necessary for a single 65K MOSRAM device, does become necessary if the system's memory array 1 is partitioned across multiple devices and the rows of the devices are not accessed as a group, but rather with the rows of some devices being accessed independent of the rows of other devices. Accessing of the device rows as a group would typically be done in a concatenating fashion, but in a block organizing memory the individual blocks can also be accessed independently and therefore their refresh requirements will vary from block to block. For this type of memory it is therefore necessary to provide a device selector such as decode 49. Decoder 49 then acts to identify the device, whereas the registers 5 and 7 would only identify the row and column. Therefore, assuming the memory array 1 is organized into four blocks, 3 bits of additional requestor address information would be required to identify the individual row. Thus address requestor bus 19 would have an additional 3 bits hardwired to the device select decoder 49 input, such that the decoder 49 would select the appropriate device in the array 1 after it had received the load signal on line 51 from control circuitry 15. The load signal would appear as a logic low pulse and be the same signal as used to load the row and column registers 5 and 7.

If the array 1 is expanded out over an increased number of devices, the refresh memory size may also need to be expanded to accommodate the increased number of rows in the array 1. The size of the RFM could be increase by coupling additional RFM's have 1 bit wide columns to another decoder, in the same fashion as the row decoder 49, so that a decode would have to be performed when addressing the RFM. The RFM could also be expanded in width (e.g. to 256×4 bits wide) with the associated $2^9$, $2^{10}$, $2^{11}$, and $2^{12}$ bit positions of the RFM address counter 11 hardwired to the respective column positions of the RFM 3. The appropriate bit position for each column in this latter use would then be accessed as the refresh operation overflowed the 256 rows of the first device (e.g. the flag bit for the 259th row of the array 1 would occur in the third row of the second column of the RFM which would be accessed when the RFM address counter 11 had counted up to 10000011).

Referring to FIG. 1 and the card select decoder 53, if the memory array 1 were further expanded to include multiple pc cards, the requestor address would again be expanded by an appropriate number of bit positions to accommodate the number of cards. This again would merely require the inclusion of a card select decoder 53 to accommodate the increased number of pc cards in the array 1 and the additional coupling of a load line 55 to the control circuitry 15 so that the requestor address would be impressed on the appropriate card within the array. Also in the same manner as for devices, the number of columns in the RFM could be further expanded to accommodate the increased number of cards, such that the count within counter 11 would be tied to the expanded bit positions representing the individual cards of the array 1.

As previously mentioned it would also be possible to change the RFM 3 to a CAM. Such a change would require the deletion of the RFM row address counter 11 and its control and a concurrent change to the control of RFM. But, the primary advantage gained would be that, now instead of having to sequentially interrogate all the addresses of the RFM 3, it would only be necessary to sequentially interrogate those addresses having a "0" stored therein. Thus a savings could be had in the total RFM 3 interrogation time. It should be noted that a master clear would now have to be performed at the end of the RFM interrogation, thereby preparing the RFM 3 for the next operating interval.

An alternative embodiment of the present invention will now be described with reference to FIGS. 2c, 6a and b and 7. In this embodiment the hidden memory refresh circuitry again operates to refresh the array 1 on an "if required" basis, but it now refreshes the array 1 in an "interleaved" mode and the RFM interrogation is performed in parallel with the normal memory cycles. One address of the RFM is interrogated and cleared during each of a number of intervals into which the RRI is subdivided and the RFM is interrogated in parallel with the accessing of the main memory array 1. If the flag bit is found not to be set during the interrogation, the system will then access that address during the allotted interval, and refresh that location. Otherwise, if the flag is set, the circuitry will clear the flag without accessing the array 1 and no impact will occur on the system's operating time.

The alternative embodiment also includes requestor priority control circuitry which, after the interrogation of the RFM 3, permits the refreshing of the corresponding memory array address during a low priority or inactive period (i.e. no other requestors present at the priority control section of control circuitry 15). If, however, the system is busy and a refresh access can't be made, a high priority period is set aside at the end of the interval and during which the system is interrupted and the memory array address is refreshed.

The establishment of an appropriate number of intervals within the RRI, however, is dependent on the number of rows (i.e. "M") in the array. The number of intervals must still be doubled through, thereby ensuring that all the addresses of the array 1 are refreshed during the RRI. For a 256×4, 65K MOSRAM having a 6 millisecond RRI, 512 intervals must be allocated with each interval being approximately 11.7 microseconds long.

Figure 2C:
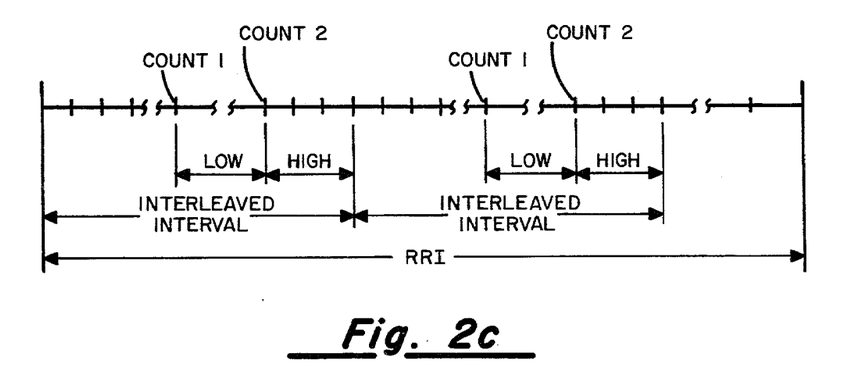
FIG. 2c is a timing diagram of a refresh requirement interval for the circuitry of FIG. 1, wherein the refresh operations are performed in a burst prior to the midpoint and end of the refresh requirement interval for those addresses not previously accessed during the operating interval.

Referring to FIG. 2c, two of such intervals can be seen as well as the prioritized refresh interval. It should be noted that each interval will accommodate twenty-three memory cycles and one refresh cycle, with each cycle again being approximately 500 nanoseconds in duration. The occurrence of the refresh cycle, however, will now be dependent on the system's requestor activity. The interrogation of the RFM 3 though will also occur in parallel with the systems normal operation, whereas before it occurred during the dedicated refresh interval.

Figure 6A:
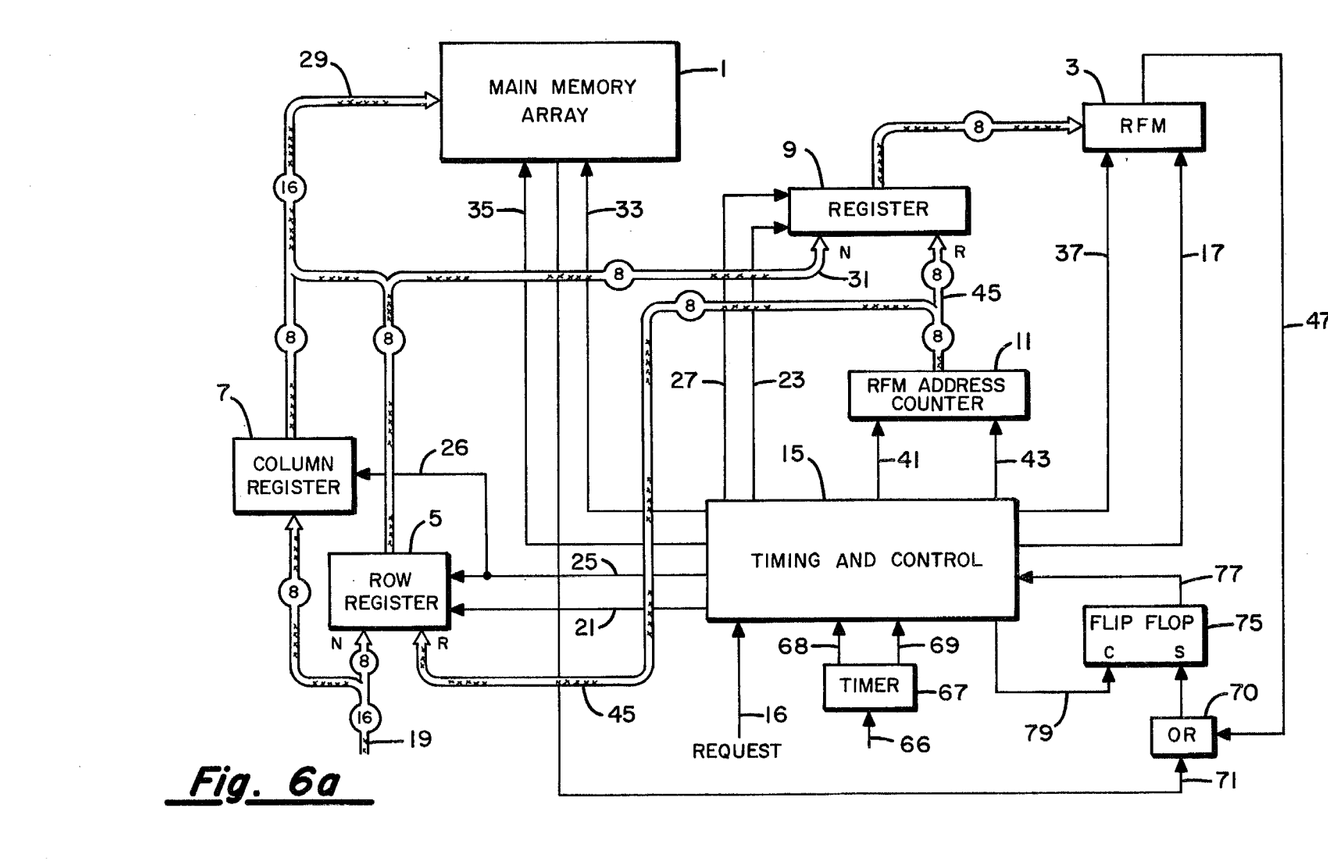
FIG. 6a is a block diagram of a memory system and its associated "interleaved," prioritized hidden memory refresh circuitry.
Figure 7:
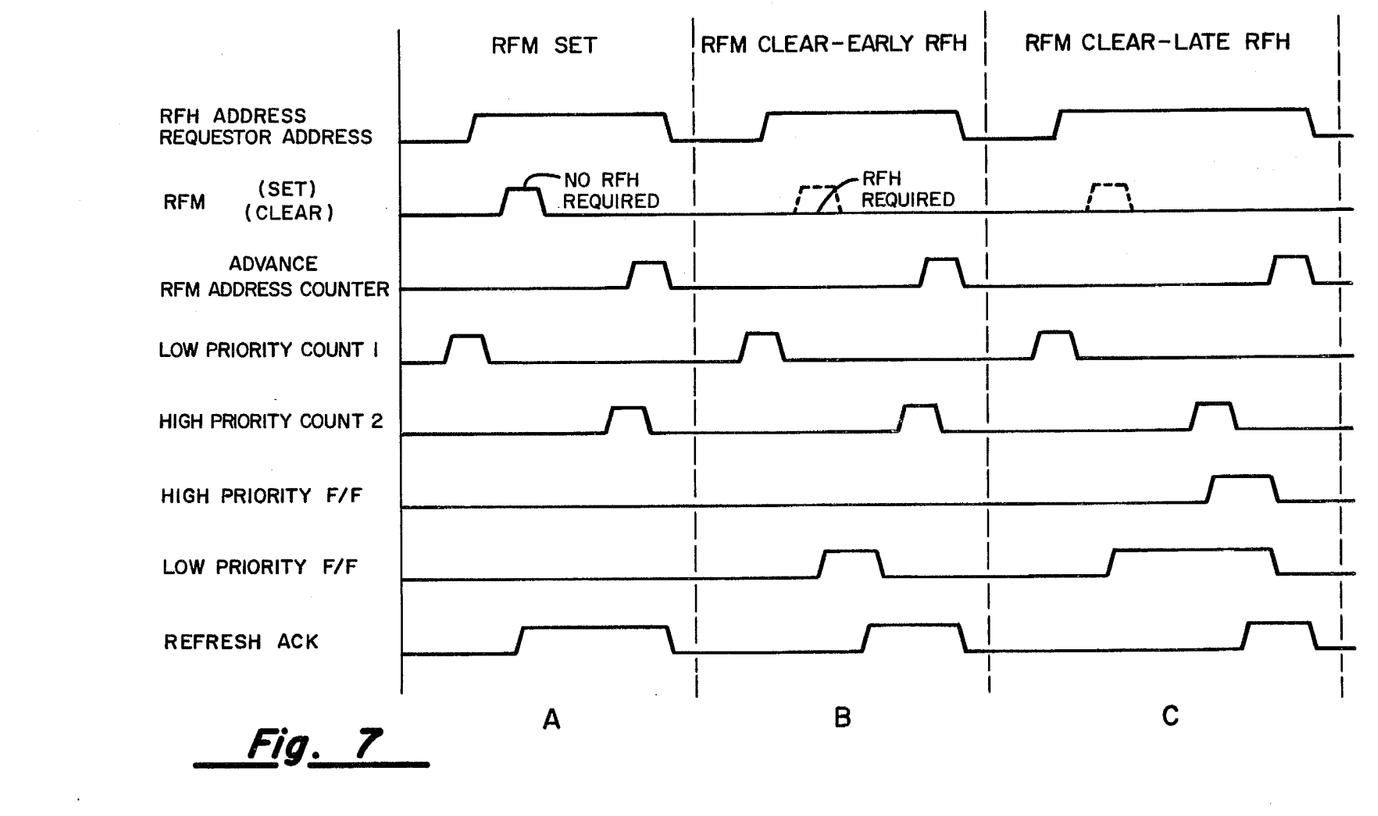
FIG. 7 shows a composite timing diagram for the various interleaved RFM conditions.

Referring to FIG. 6a and the A, B and C portions of FIG. 7, the alternative embodiment will be described with reference to the typical refresh conditions that are encountered as the RFM 3 is interrogated and with respect to the dual priority refresh interval. The refresh conditions are RFM set, RFM clear-early refresh and RFM clear-mandatory refresh. It should be noted that the normal memory cycle and array refresh operating conditions remain the same as previously described and will therefore not be described again.

Figure 6B:
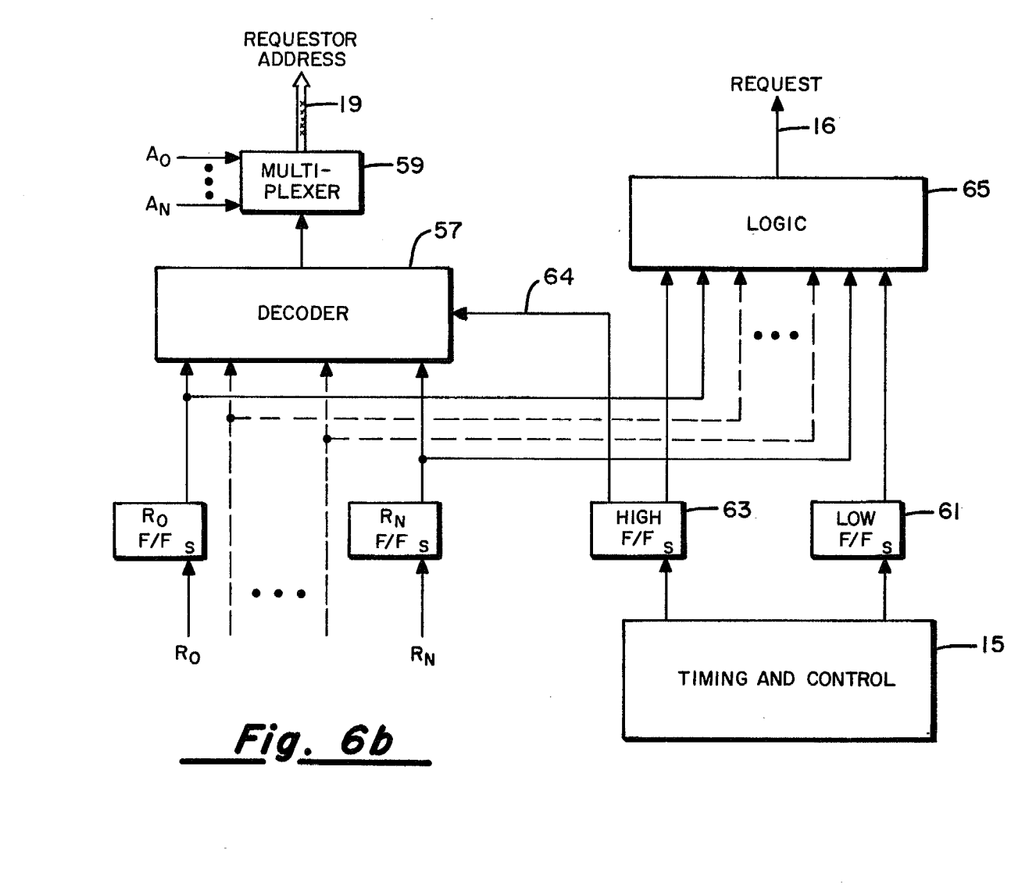
FIG. 6b is a block diagram of the priority control section of the control circuitry of FIGS. 1 and 6.

Prior to describing the refresh conditions though, reference should be made to FIG. 6b and the priority control section of control circuitry 15. The priority control, as mentioned, was present in the control circuitry 15 of the previously described "burst" mode refresh scheme, but a detailed description was not previously necessary. It generally is used to select a requestor from among the system's requestors for each memory cycle and to produce the associated access request signal on line 16 and the requestor address on address bus 19. The circuitry has been changed however to accommodate the low and high priority requestors that have been added.

In particular, the priority control circuitry is comprised of the individual requestor flip-flops $R_0$ to $R_N$, decoder 57, multiplexer 59, the low and high priority flip-flops 61 and 63 and the logic circuitry 65 necessary to produce the access request signal on line 16. At the start of each memory cycle, the decoder 57 selects from among the $R_0$ to $R_N$ requestor inputs, on a prioritized basis, and produces a coded output that is used by the multiplexer 59 to select from among the associated requestor addresses coupled to its $A_0$ to $A_N$ inputs. The selected address is then transmitted via address bus 19. While the requestor address is being decoded, the refresh and requestor inputs are coupled to the logic circuitry 57 and the access request signal specifying a normal or refresh request is produced. A logic high indicating a normal request and a logic low indicating a refresh request.

Accommodating the "interleaved" refresh requirement, also requires another slight modification of the "burst" mode refresh circuitry, and that is to provide a dual output timer 67. The timer 67 is essentially comprised of two preset counters having their preset counts established by the system designer to accommodate the system activity (i.e. to have the majority of the refreshes occur during inactive array time). The first count establishes the start of the low priority portion of the refresh interval and initiates the interrogation of the RFM 3. The second count then establishes the start of the high priority portion of the interval and which portion is presently three memory cycles long to ensure that the refresh request output of the high priority flip-flop 63 gains priority before the end of each interval, since it is possible that the refresh request might not be present until the last available memory cycle.

Returning to the description of the alternate refresh operation, until the first preset count is encountered the system will proceed in a normal mode, accessing the array 1 during each memory cycle, setting the corresponding flag bit in the RFM 3 and advancing the timer 67 via line 66 at the clock rate. Upon reaching the first preset count though and referring to the A portion of FIG. 7, a pulse will be transmitted via line 68 to the control circuitry 15. The control circuitry 15 will then transmit a refresh select signal via line 23 to establish the selector/register 9 in a refresh mode; a clear signal via line 41 to clear refresh address counter 11, thus establishing the first address to be interrogated in the RFM 3; and the appropriate read/write signals on lines 17 and 37 to establish the RFM 3 in an interrogate condition. The contents of the RFM 3 at the first address in counter 11 will then be read; and if the flag bit is set a "1" will be read and transmitted via line 47 to "or" gate 70 and from there via line 73 to the refresh acknowledge flip-flop 75 which will then become set. The set output of flip-flop 75 is then transmitted via line 77 to control circuitry 15 and used to prevent the setting of the low priority flip-flop 61, thereby presenting a refresh access from being made on the occurrence of the high priority signal.

The RFM flag bit will next be cleared to "0," as previously described; selector/register 9 will return the normal mode; and the set condition of the refresh acknowledge flip-flop 75 will remain. When the second preset count occurs on line 69, the set condition of flip-flop 75 is used by the control circuitry 15 to prevent the setting of the high priority flip-flop 63 and again prevent the interruption of the system and the refreshing of the array 1. Upon the occurrence of the high priority count pulse, the control circuitry 15 also produces an advance signal on line 43 to advance the refresh address counter 11 and a clear signal on line 79 to clear the refresh acknowledge flip-flop 75. And, with the expiration of the advance signal, the refresh interval will terminate with the next RFM address resident in refresh address counter 11 and which address will be interrogated upon the occurrence of the first preset or low priority count in the next interval.

If during the interrogation of the RFM 3 the refresh circuitry detects a "0," thus necessitating a refresh access to the array, a RFM clear condition will exist. Referring to the B portion of FIG. 7 and assuming the refresh can be performed during the low priority period of the interval, the RFM clear-early refresh condition will now be described. Upon reading the "0" from the RFM 3 a logic low is transmitted via line 47 "or" gate 70 and line 73 to the refresh acknowledge flip-flop 75 which, now instead of setting will remain cleared. The cleared condition will then be transmitted to the control circuitry 15 and which in response will cause a logic high to be impressed via line 60 on the low priority refresh flip-flop 61 and cause it to set. At the same time the control circuitry 15 will transmit a deselect signal via line 23 to selector/register 9 to return it to the normal mode.

As a result of these events, a low priority refresh request is presented to decoder 57 and which request will be evaluated with all the other requests that are present at the start of the next successive memory cycles. Because the refresh request of flip-flop 61 has the lowest priority though, it will not be selected until no other requestors are present.

Assuming that no other requestors are present, the decoder 57 will select the flip-flop 61 refresh request and transmit a refresh request signal on line 16 to the control circuitry 15. The control circuitry 15 responding to the refresh request will then cause a select signal to be impressed on line 21 which will cause selector/register 5 to change to a refresh access mode. A load signal will then be impressed on line 25 and the refresh address contained in counter 11, which address throughout the interval is also present on the inputs to the selector/register 5, will be loaded and used to refresh the corresponding row of the array 1. Upon the refreshing of the array 1, the memory refresh acknowledge signal is then produced by the memory array 1 and is transmitted via line 71 to "or" gate 70 and then to flip-flop 75. Flip-flop 75 will set and again remain in a set state until the end of the interval and block the second, high priority count pulse as before.

If however other requestors are present during the low priority period, the decoder 57 will not grant priority to the refresh request of flip-flop 61. On the occurrence of the second, high priority count pulse on line 69 though, a RFM clear-mandatory refresh condition will occur (see the B portion of FIG. 7). This condition will result because the control circuitry 15 in response to the low from the refresh acknowledge flip-flop 61 and the second count pulse will produce a logic high on line 62 and cause the high priority flip-flop 63 to set. The set condition of flip-flop 63 will then cause decoder 57 to be deactivated via the logic low on line 64 and the logic circuitry 65 will produce a refresh request signal on line 16. The control circuitry will respond to the refresh request and cause a refresh access to the array 1 and the advancement of the refresh address counter 11.

The alternative "interleaved" refresh scheme thus operates essentially as the "burst" mode scheme. The RFM 3, however, is interrogated in parallel with the array's normal activities and the refresh accesses are made to only those addresses not previously accessed. An improvement however being achieved by making the RFM transparent to or hidden from the system and in utilizing otherwise wasted time by permitting the refresh access to occur during memory cycles when the array is not accommodating other requestors.

The use of one refresh scheme over the other would however be dependent on the characteristics of the system itself and the frequency of the requestor activity. But in any event, the present refresh scheme and circuitry offers an alternative solution to the refresh problem over those previously discussed and in a cost effective manner. It should also be obvious from the above description that the present embodiments could be changed in form and detail by one having skill in the art without departing from the spirit and scope of the following claimed invention.

What is claimed is:

1. A memory system comprising:
an array of memory cells, said array divided into a plurality of addressable segments with each segment containing a plurality of said memory cells and each of said memory cells requiring the restoration of the information stored therein during periodic refresh requirement intervals (RRI);
first means for selectively accessing said segments, and each access causing the restoration of the information stored in the memory cells of the accessed segment;
refresh memory means for maintaining a record of the addresses of all of said segments accessed during an operating interval with said RRI;
clock means for providing a time interrupt demarking the beginning of a refresh interval during said RRI; and
second means for interrogating said refresh memory means commencing upon said time interrupt and proceeding during a variable length refresh interval within said RRI and causing said first means to access only those of said segments not accessed during said operating interval, thereby restoring only those of said memory cells not accessed during said operating interval.

2. A memory system comprising:
an array of memory cells, said array divided into a plurality of addressable segments with each segment containing a plurality of said memory cells and each of said memory cells requiring the restoration of the information stored therein during a refresh interval (RRI);
a refresh address counter for generating the addresses of said segments during a refresh interval within said RRI;
first and second registers each operable in a normal mode during an operating interval within said RRI or a refresh mode during said refresh interval, said first register gating system requestor addresses and the addresses of said refresh address counter to said array during said respective normal and refresh modes and said second register gating system requestor addresses and the addresses of said refresh address counter to said refresh memory means during said respective normal and refresh modes;
means responsive to said system requestor addresses and the addresses of said refresh address counter for accessing said segments, each access causing the restoration of the information stored in the memory cells of the accessed segment;
refresh memory means for maintaining a record of the addresses of all segments accessed during said operating interval;
means for controlling said normal and said refresh modes so that said refresh modes commence at equal time intervals so that when system requestors access said array during said normal mode a flag is set in said refresh memory means at an address corresponding to said system requestor address and so that during said refresh mode the addresses of said refresh memory means are interrogated and in response thereto said accessing means accesses only said array segments which were not accessed during said operating interval, thus restoring only those of said memory cells that were not accessed during said operating interval and ensuring the restoration of all of said memory cells during said RRI.

* * * * *